United States Patent
Skytt et al.

[19]

[11] Patent Number: 6,107,643
[45] Date of Patent: Aug. 22, 2000

[54] PHOTOCONDUCTIVE SWITCH WITH DOPING ADAPTED TO THE INTENSITY DISTRIBUTION OF AN ILLUMINATION SOURCE THEREOF

[75] Inventors: Per Skytt; Erik Johansson; Mark Irwin, all of Västerås, Sweden

[73] Assignee: ABB AB, Vasteras, Sweden

[21] Appl. No.: 09/275,000

[22] Filed: Mar. 24, 1999

[51] Int. Cl.[7] .................. H01L 31/0312; H01L 31/00
[52] U.S. Cl. .................. 257/77; 257/450; 257/463; 257/607; 257/608
[58] Field of Search .................. 257/77, 439, 450, 257/461, 463, 431, 607, 608

[56] References Cited

U.S. PATENT DOCUMENTS

| | | | |
|---|---|---|---|
| 4,993,033 | 2/1991 | Lin | 372/30 |
| 5,223,721 | 6/1993 | Iida et al. | 257/77 |
| 5,382,822 | 1/1995 | Stein | 257/410 |
| 5,448,098 | 9/1995 | Shinohara et al. | 257/441 |
| 5,525,815 | 6/1996 | Einset | 257/77 |
| 5,536,953 | 7/1996 | Dreifus et al. | 257/77 |
| 5,562,769 | 10/1996 | Dreifus et al. | 117/86 |
| 5,592,053 | 1/1997 | Fox et al. | 315/3 |
| 5,650,337 | 7/1997 | Cahen et al. | 257/430 |
| 5,808,349 | 9/1998 | Papadopoulos | 257/421 |
| 5,912,455 | 6/1999 | Pocholle et al. | 250/214 R |

OTHER PUBLICATIONS

Zhu et al., Growth and Characterization of Diamond Films on Nondiamond Substrates for Electronic Applications, Proceedings of the IEEE, vol. 79, No. 5, 1991, pp. 621–646.

*Primary Examiner*—Minh Loan Tran
*Attorney, Agent, or Firm*—Pollock, Vande Sande & Amernick

[57] ABSTRACT

A photoconductive switch, having at least a part of a first layer doped with dopants providing substantially no free charge carriers for charge transport between the electrodes at the normal operation temperature of the switch, has the nature of the doping, i.e., concentration, type (n or p). The dopants, varied from the first side to an opposite, second side of the first layer for co-operating with the intensity distribution of the light emitted by an illumination source, strikes the first side versus energy so as to obtain a substantially even creation of free charge carriers throughout the depth of the first layer from the first to the second side when illuminated by the illumination source.

23 Claims, 1 Drawing Sheet

PHOTOCONDUCTIVE SWITCH WITH DOPING ADAPTED TO THE INTENSITY DISTRIBUTION OF AN ILLUMINATION SOURCE THEREOF

BACKGROUND OF THE INVENTION

The present invention relates to a photoconductive switch comprising a first layer of a first material and two contact electrodes arranged on the first layer and connectable to different potentials for applying a voltage through the first layer therebetween. The first layer is adapted to be conducting upon applying a voltage across the contact electrodes when a first side thereof is exposed to illumination through an illumination source of an energy high enough for creating free charge carriers in the first layer. The first layer has at least a part thereof doped with dopants providing substantially no free charge carriers for charge transport between the electrodes at the normal operation temperature of the switch.

A switch of this type finds many applications, and it may for instance be used in equipment for handling high electric power for switching high voltages (which may be 2–400 kV) and currents, for example in surge diverters, current limiters and the like. An advantage of a switch of this type is that illumination control provides for a very fast switching, which is of particular importance in high power applications for protection of the equipment when faults occur.

For a good function of such a switch it is important that the leakage current is low when the switch is open, i.e. when the first layer is not illuminated through the source, and that the switch may be quickly closed and have a low on-state voltage and a high current handling capability when the first layer is illuminated through the source. Accordingly, "dopants providing substantially no free charge carriers for charge transport between the electrodes at the normal operation temperature of the switch" means that the number of such free charge carriers will be low with respect to the number of the dopants at the operation temperature, which will normally, but not exclusively, be room temperature. The material of the first layer may be practically any layer that may be doped in this way, but the invention is in particular directed to wide band gap materials, since they are easier to dope so that the condition of the charge carriers at the normal operation temperature is fulfilled.

The spectral distribution of an illumination source (a lamp) used for such a switch is most often difficult to change, and the light with higher energies will in known switches be absorbed through the parts of the first layer located closest to the first side and generate free charge carriers (electron-hole pairs) there, whereas light of longer wave lengths will pass through the entire first layer without creating any free charge carriers. This means that the resistance of the parts of the first layer closest to the second side will be rather high resulting in a comparatively high on-state voltage and power losses in the closed state of the switch. Furthermore, space charge regions may be created, and the electric field will vary through the first layer and be much higher close to the second side, which will result in different problems, such as stability problems. These problems would also be present if an illumination source emitting light of only one determined wave length were used, since more light would be absorbed closer to the first side than near the second side.

SUMMARY OF THE INVENTION

The object of the present invention is to provide a switch defined in the introduction, which at least partially solves the problems mentioned above of known switches with respect to the on-state characteristics.

This object is, according to the invention, obtained by providing such a switch in which the nature of the doping of the first layer, i.e. concentration, type (n or p) and dopants, varies from the first side to the opposite, second side of said first layer for co-operating with the intensity distribution of the light emitted by the illumination source versus energy so as to obtain a substantially even creation of free charge carriers throughout the depth of the first layer from the first to the second side when illuminated by the illumination source.

By varying the nature of the doping in this way depending upon the intensity of the light emitted by the illumination source at different wave lengths and the depths of the first layer, a substantially even creation of electron-hole pairs throughout the first layer from the first side to the second side may be obtained when the illumination source is turned on for closing the switch. This means that space charge regions in the first layer may be avoided, that the resistance per length unit in the direction from the first side to the second side will be almost constant and low resulting in a low on-state voltage and low power losses when the switch is closed, and that the electric field will be substantially the same throughout the first layer when the switch is closed. Such a photoconductive switch will be able to ensure a low leakage current when opened and quickly and reliably be closed by the illumination source while taking care of larger currents with low power losses. How the nature of the doping is to be varied from the first side to the opposite, second side of the first layer may be calculated by a person with skill in the art having the knowledge of the intensity distribution of the light emitted by the illumination source to be used in the switch versus energy and the material of the first layer. The nature of the doping is then preferably varied so that the light spectrum of the illumination source will be better utilized, namely especially by utilizing lower energies not utilized in switches of this type already known for creating such free charge carriers deep inside the first layer.

According to a preferred embodiment of the invention at least the first sub-layer of the first layer is doped with dopants of one conductivity type, p or n, according to a doping concentration gradually increasing in the direction from the first to the second side of the first layer. By gradually increasing the doping concentration in this direction the higher probability of a creation of the free charge carriers by light reaching deep into the first layer will compensate for the fact that the intensity of the light reaching deep into the first layer will be lower than the intensity close to the first side thereof.

According to another preferred embodiment of the invention the doping concentration of the first sub-layer increases step-wise in the direction from the first to the second side of the first layer. Such a step-wise increase of the doping concentration will in most cases be easier to obtain than a continuous increase of the doping concentration, and it will do perfectly for obtaining a substantially even creation of free charge carriers throughout the depth of the first layer. The result will of course be improved with a reduction of the length of the steps.

According to another preferred embodiment of the invention the doping concentration of the first sub-layer increases continuously in the direction from the first to the second side of the first layer. This makes it possible to obtain a very even creation of the free charge carriers throughout the depth of the first layer with a practically constant resistance and voltage drop per length unit in the direction from the first to the second side.

According to another preferred embodiment of the invention the first layer comprises at least two sub-layers doped with different dopants and the sub-layer closest to the first side is doped with dopants requiring a higher excitation energy for delivering free charge carriers than the dopants of the other sub-layer located closer to the second side of the first layer than the former sub-layer. This means that light of higher energies are required for creating free charge carriers in the sub-layer first reached by the light, and the light of wave lengths being too long for creating free charge carriers in that sub-layer may pass therethrough and create free charge carriers in the other sub-layer closer to the second side for obtaining a substantially even creation of such charge carriers throughout the depth of the first layer.

According to another preferred embodiment of the invention the two sub-layers doped with different dopants are of different conductivity type, p or n. Donors and acceptors in a determined material often require considerably different energies for being excited to delivering free charge carriers, so it may be preferred to use dopants of different conductivity types for varying the nature of the doping in a way leading to the goal of the present invention.

According to another preferred embodiment of the invention the first layer comprises a sub-layer closest to the first side thereof of an intrinsic material. This means that the energy of the light needed to create free charge carriers in this sub-layer will principally correspond to the energy gap between the valence band and the conduction band of the material of the first layer, and light of higher energies will be absorbed by this layer, whereas free charge carriers may be created in sub-layers "behind" this sub-layer through light of lower energies being high enough with respect to the energy levels of the dopants used.

According to a very preferred embodiment of the invention the first material is diamond. For diamond it is easy to find dopants providing substantially no free charge carriers for charge transport between the electrodes at the temperatures mostly prevailing in the environment of such switches, and diamond has several properties making it well suited as a material for such a photoconductive switch. A switch of diamond as the first material will have a low leakage current in the open state and it may have low on-state losses and a high current handling capability due to the high charge carrier mobility of diamond. Furthermore, diamond has the highest known thermal conductivity of any solid near room temperature, which makes it well suited for high power applications. Furthermore, when for instance N is used as donor and B as acceptor in the diamond layer, light of energies above 1.7 eV and 0.3 eV, respectively, may be utilized, whereas the energy required for creating free charge carriers in the first layer by lifting charge carriers from the valence band to the conduction band of diamond will be approximately 5.5 eV. Thus, a use of one or both of these dopants at suitable locations with respect to the depth in the first layer with an appropriate concentration distribution will make it possible to better utilize the spectrum of the light emitted by the illumination source and by that enhancing the performance of the switch. It will then be suitable to dope the sub-layer closest to the first side with N and the sub-layer closer to the second side with B for utilizing light of longer wave lengths not absorbable by the sub-layer first mentioned for creation of free charge carriers in the sub-layer closest to the second side.

According to another preferred embodiment of the invention the first material of the first layer is SiC. This wide band gap material is also well suited for a switch of this type.

The invention also relates to a method for producing a photoconductive switch according to above, in which the first layer is produced by an epitaxial growth, and the ingredients provided for the growth, i.e., the partial gas pressure thereof, are varied as the growth continues from one side to the other of the first layer for varying the nature of the doping from the first to the second side of the layer. A switch according to the invention may in this way be produced by utilizing traditional growth techniques, of which Chemical Vapour Deposition is a preferred such technique.

According to a preferred embodiment of the invention the epitaxial growth is carried out while having the same dopants and doping concentration in a sub-layer grown and changing either the doping concentration or the dopants for the sub-layer growing on top thereof. Such a step-wise change of the nature of the doping is easy to accomplish with known growth techniques and is therefor preferable.

According to another preferred embodiment of the invention a method for producing a photoconductive switch according to the invention is characterized in that a first layer is in a first step grown by epitaxy and that an implantation of dopants thereinto is then carried out from the first or second side while using different implantation energies and/or dopants for obtaining a variation of the nature of doping from the first to the second side of the first layer. This technique may be utilized to obtain a well defined doping concentration of a certain conductivity type at determined depths of the first layer, but it is restricted to switches having a first layer which is not too thick, since implantation energies damaging the first layer will otherwise be needed for reaching also deep regions of that layer.

BRIEF DESCRIPTION OF THE DRAWING

With reference to the appended drawing, below follows a specific description of preferred embodiments of the invention cited as examples.

In the drawing.

DETAILED DESCRIPTION OF PREFERRED EMBODIMENTS OF THE INVENTION

Figure 1:
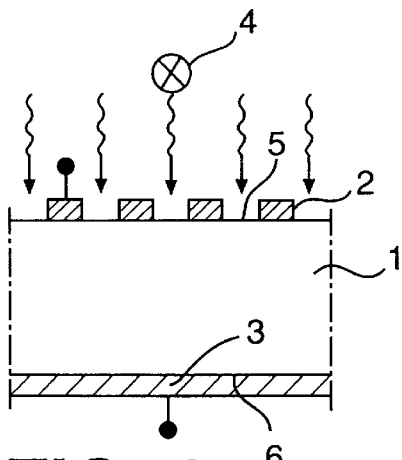
FIG. 1 is a schematic cross-section view of an illumination controlled switch of the type to which a switch according to the present invention belongs.

A switch of the type to which the present invention is directed is illustrated in FIG. 1, and this switch has a first layer 1 of monocrystalline or polycrystalline material, which in this case is made of diamond and typically may have a thickness of about 200 $\mu$m, and two contact electrodes 2,3 arranged on opposite sides of the first layer and connectable to different potentials for applying a voltage thereacross. Accordingly, the two contact electrodes are adapted to be connected, to for example, an electric circuit of an apparatus for controlling a power network. The switch also comprises an illumination source 4 adapted to expose a first side 5 of the first layer to light typically having an energy distribution illustrated in FIG. 2, in which the intensity I is plotted versus energy E. Should the first layer 1 is made of intrinsic diamond this will mean that only light of energies above 5.5 eV could be used for creating free charge carriers therein and closing the switch. In this case only a small part of the light intensity, namely in the region A, would be used for fulfilling the task of the illumination source 4. This means that a lot of power will be wasted and that the illumination source has to be overdimensioned.

Figure 2:
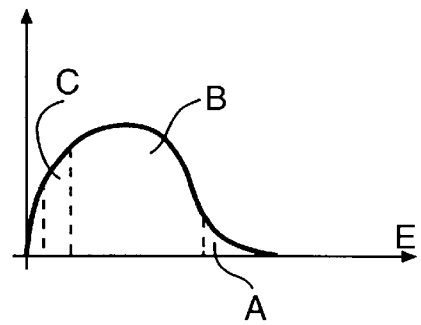
FIG. 2 is a diagram of the light intensity versus energy of a typical illumination source used in a photoconductive switch of the type shown in FIG. 1.
Figure 3:
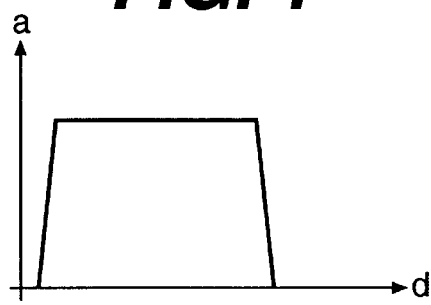
FIG. 3 is a diagram of the creation of electron hole pairs versus depth of a switch constructed according to the principals of the present invention.

In the switch according to the present invention at least a part of the first layer is doped with dopants providing substantially no free charge carriers for charge transport between the electrodes at the normal operation temperature of the switch, which may for instance be nitrogen N having an excitation energy of 1.7 eV and boron B having an excitation energy of 0.3 eV. The nature of the doping of the first layer, i.e. concentration, type (n or p) and dopants, varies from the first side to the opposite, second side 6 of the first layer for co-operating with the intensity distribution of the light emitted by the illumination source versus energy as illustrated in FIG. 2 so as to obtain a substantially even creation of free charge carriers throughout the depth of the first layer from the first 5 to the second 6 side when illuminated by the illumination source 4. This substantially even creation of free charge carriers Q throughout the depth d aimed at, as illustrated in FIG. 3, and the advantages thereof have been thoroughly discussed above.

Figure 4:
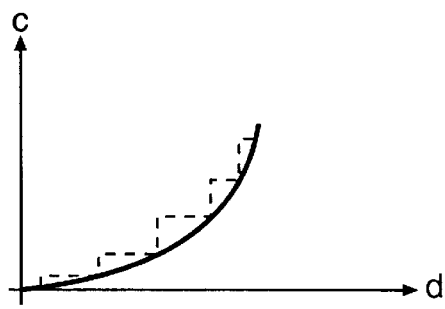
FIG. 4 is a diagram of the doping concentration versus depth of the first layer in a switch according to a preferred embodiment of the invention.

When the same dopant is used throughout the entire first layer or in any way through a thicker sub-layer thereof, it is preferred to obtain the substantially even creation of free charge carriers by gradually increasing the doping concentration c with the depth d of the first layer as shown in FIG. 4. This may be obtained either through a continues increase of said doping concentration (continuous line) or a step-wise increase thereof (dashed line), which may in the practice often be easier to obtain, but may also result in a substantially even creation of free charge carriers throughout the depth of the first layer when the lengths of the steps are appropriately selected.

Figure 5:
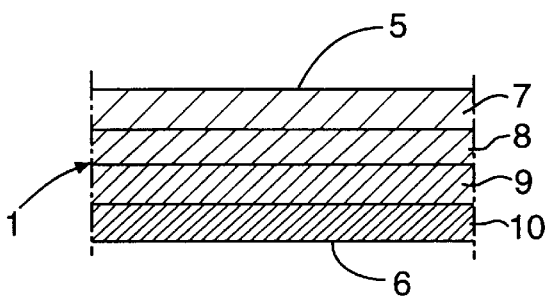
FIGS. 5–8 are schematic cross-section views of the first layer of switches according to preferred embodiments of the invention.

FIG. 5 illustrates in a simplified manner a possible design of the first layer 1 with four sub-layers 7–10, which are all of n-type through doping by N, but the doping concentration thereof increases step-wise from the first side 5 to the second side 6 in the sense illustrated by the dashed line in FIG. 4. Light with an energy above 1.7 eV, i.e. a wavelength shorter than 720 nm, may be absorbed by these layers while creating an electron-hole pair. Accordingly, if we assume that the energies above 5.5 eV (region A in FIG. 2) will generate free charge carriers from the diamond, the light within the region B in FIG. 2 may be utilized for creating additional free charge carriers when the first layer is illuminated for closing the switch. Less photons will reach the sub-layer 10 than for instance the sub-layer 9, but the higher doping concentration of this layer makes the possibility that a photon will be absorbed there higher. The doping concentrations may typically be within the range of $10^{17}$ cm$^{-3}$ to $10^{20}$ cm$^{-3}$.

Figure 6:
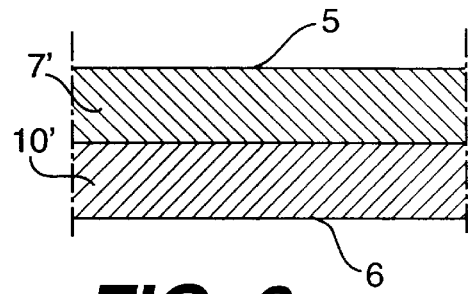

FIG. 6 illustrates another possible design of the first layer having two sub-layers doped according to different conductivity types, namely a sub-layer 7' closest to the first side 5 of n-type through doping by N and a sub-layer 10' closest to the second side 6 of p-type doped by B. All energies above 0.3 eV may be used for creating electron-hole pairs in the p-type layer, which means that light within the region C in FIG. 2, which may not be absorbed by the sub-layer 7', may be utilized to create electron-hole pairs in the sub-layer 10'. The doping concentration of the two sub-layers are chosen so that a substantially even creation of free charge carriers throughout the depth of the first layer is obtained, and the two sub-layers may very well have a graded doping concentration with an increase in the direction from the first side 5 to the second side 6. It is of course also within the scope of the invention to have each of these sub-layers split into additional sub-layers with a step-wise doping profile as illustrated in FIG. 4.

Figure 7:
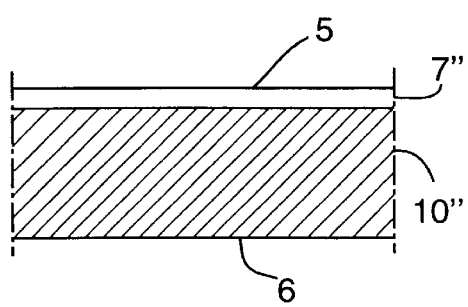

FIG. 7 illustrates a further possible design of the first layer of the switch, in which a sub-layer 7" of intrinsic diamond is located closest to the first side 5 and the second sub-layer 10" of n-type, for instance doped by N or P, is arranged thereunder. The top layer 7" may substantially only absorb lights with an energy above 5.5 eV, whereas the sub-layer 10" can also absorb light of longer wave lengths. The latter sub-layer may very well have a graded doping profile according to one of the two options shown in FIG. 4.

Figure 8:
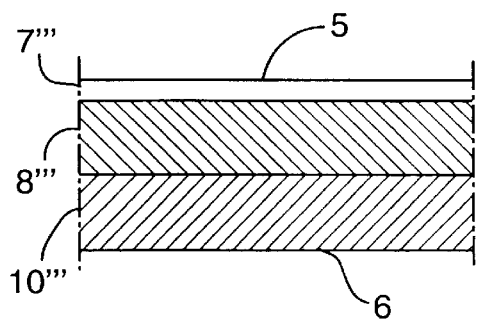

FIG. 8 illustrates a still further possible design of the first layer, which constitutes a combination of the embodiments according to FIGS. 6 and 7 and has a top sub-layer 7''' of intrinsic diamond, a middle sub-layer 8''' of n-type and a lower sub-layer 10''' of p-type. It is of course possible that the two layers 8''' and 10''' are of the same conductivity type but doped with different dopants, so that for instance one layer 8''' may be doped with B and the layer 10''' with N.

The invention is of course not in any way restricted to the preferred embodiments described above, but many possible to modifications thereof would be apparent to a person with ordinary skill in the art without departing from the basic idea of the invention as defined in the appended claims.

The number of sub-layers may for instance be other than the numbers shown in the figures for explaining the invention as clearly as possible, and it may for instance be well above 10.

It is emphasized that the sides on which the two contact electrodes are arranged do not to be the same as the first and second side, but it is within the scope of the invention to illuminate the first layer from a side having no such electrodes, for instance laterally in the switch illustrated in FIG. 1, in which then the lateral side first struck by the light will be the first side and the opposite lateral side the second side and the nature of the doping will then be varied in the lateral direction.

The electrodes may even be arranged on the same side of the first layer laterally spaced, and it is in such a case just as important that a substantially even creation of charge carriers may be obtained in the first layer between the two contact electrodes. The first layer may also be illuminated on surfaces than other those of the first side, such as also from the second side. Furthermore, the light emitted by the illumination source may be of substantially one single determined wave length.

What is claimed is:

1. A photoconductive switch comprising a first layer of a first material and two contact electrodes arranged on opposite sides of said first layer and connectable to different potentials for applying a voltage through the first layer therebetween, said first layer being adapted for conducting upon applying a voltage across said contact electrodes when a first side thereof is exposed to illumination through an illumination source of an energy high enough for creating free charge carriers in said first layer, said first layer having at least a part thereof doped with dopants providing substantially no free charge carriers for charge transport between the electrodes at the normal operational temperature of the switch, wherein characteristics of said doping of said first layer vary from said first side to an opposite, second side of said first layer for co-operating with n intensity distribution of the light emitted by said illumination source versus energy so as to obtain a substantially even creation of free charge carriers throughout a depth of the first layer from said first to said second side when illuminated by said illumination source.

2. A switch according to claim 1, wherein said first layer includes a number of sub-layers which are doped with dopants of one conductivity type according to a doping concentration gradually increasing in a direction from said first to said second side of said first layer.

3. A switch according to claim 2, wherein said doping concentration of said sub-layers increases step-wise in the direction from said first to said second side of the first layer.

4. A switch according to claim 2, wherein said doping concentration of said sub-layers increases continuously in the direction from said first to said second side of the first layer.

5. A switch according to claim 1, wherein the entire first layer is doped with dopants of the same conductivity type.

6. A switch according to claim 1, wherein that said first layer comprises at least two sub-layers doped with different dopants, and that the sub-layer closest to the first side is doped with dopants requiring a higher excitation energy for delivering free charge carriers than the dopants of the other sub-layer located closer to the second side of the first layer.

7. A switch according to claim 6, wherein said two sub-layers doped with different dopants are of different conductivity types.

8. A switch according to claim 6, wherein the first layer comprises three superimposed sub-layers, including a sub-layer of intrinsic material arranged closest to the first side and two, with respect to the direction from the first side to the second side, subsequent sub-layers doped with different conductivity types.

9. A switch according to claim 6, wherein the doped sub-layer closest to the first side is doped with N or P and the other doped sub-layer is doped with B.

10. A switch according to claim 1, wherein said first layer comprises a sub-layer closest to the first side thereof made of an intrinsic material.

11. A switch according to claim 10, wherein the doped sub-layer closest to the first side is doped with N or P and the other doped sub-layer is doped with B.

12. A switch according to claim 1, wherein said first material of the first layer is a wide band-gap material.

13. A switch according to claim 12, wherein said first material is diamond.

14. A switch according to claim 1, wherein at least a sub-layer of said first layer is of n-type and provided with N or P as donors.

15. A switch according to claim 14, wherein the doped sub-layer closest to the first side is doped with N or P and the other doped sub-layer is doped with B.

16. A switch according to claim 1, wherein at least a sub-layer of said first layer is of p-type and provided with B as acceptors.

17. A switch according to claim 16, wherein the doped sub-layer closest to the first side is doped with N or P and the other doped sub-layer is doped with B.

18. A switch according to claim 1, wherein said first material of the first layer is SiC.

19. A method for producing a photoconductive switch according to claim 1, characterised in that the first layer is produced by an epitaxial growth, and that the ingredients provided for said growth, is varied as the growth continues from one side to the other of the first layer for varying the characteristics of doping from the first to the second side of the first layer.

20. A method according to claim 19, wherein the epitaxial growth is carried out while having the same dopants and doping concentration in a first sub-layer grown and changing either the doping concentration or the dopants for another sub-layer grown on top thereof.

21. A method according to claim 19, wherein said epitaxial growth of the first layer is followed by an implantation of dopants carried out from one of said first and second side for determining the doping concentration of a sub-layer of the first layer closest to that side.

22. A method according to claim 19, wherein Chemical Vapour Deposition is utilised for said epitaxial growth.

23. A method for producing a photoconductive switch according to claim 1, wherein the first layer is in a first step grown by epitaxy, and that an implantation of dopants thereinto is then carried out from said first or second side while using different implantation energies and/or dopants for obtaining a variation of the characteristics of doping from the first to the second side of the first layer.

* * * * *